United States Patent
Ahn et al.

(10) Patent No.: US 9,148,955 B2
(45) Date of Patent: Sep. 29, 2015

(54) MOUNTING STRUCTURE OF CIRCUIT BOARD HAVING MULTI-LAYERED CERAMIC CAPACITOR THEREON

(75) Inventors: Young Ghyu Ahn, Gyeonggi-do (KR); Byoung Hwa Lee, Gyeonggi-do (KR); Min Cheol Park, Gyeonggi-do (KR); Sang Soo Park, Gyeonggi-do (KR); Dong Seok Park, Seoul (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/481,348

(22) Filed: May 25, 2012

(65) Prior Publication Data

US 2012/0298407 A1  Nov. 29, 2012

(30) Foreign Application Priority Data

May 26, 2011  (KR) .................. 10-2011-0050103

(51) Int. Cl.
  *H05K 1/18* (2006.01)
  *H05K 1/11* (2006.01)
  *H05K 3/34* (2006.01)

(52) U.S. Cl.
  CPC ............ *H05K 1/111* (2013.01); *H05K 3/3442* (2013.01); *H05K 2201/10015* (2013.01); *H05K 2201/2045* (2013.01)

(58) Field of Classification Search
  CPC ............ H05K 1/111; H05K 3/3442; H05K 2201/2045; H05K 2201/10015; H01G 4/12; H01G 4/30

USPC .......... 361/300–308.2, 763–766, 321.2, 743, 361/78; 29/832, 839, 840; 174/263; 257/779

See application file for complete search history.

(56) References Cited

U.S. PATENT DOCUMENTS 4,870,225 A * 9/1989 Anao et al. ................ 174/261
H000921 H * 5/1991 Wannemacher, Jr. ........ 361/767
5,453,581 A * 9/1995 Liebman et al. .............. 174/261

(Continued)

FOREIGN PATENT DOCUMENTS

JP   2002-299193 A   10/2002
JP   2002-343668 A   11/2002

(Continued)

*Primary Examiner* — Tuan T Dinh
*Assistant Examiner* — Steven T Sawyer
(74) *Attorney, Agent, or Firm* — McDermott Will & Emery LLP

(57) ABSTRACT

Disclosed herein is a mounting structure of a circuit board having a multi-layered ceramic capacitor thereon. The mounting structure of a circuit board having a multi-layered ceramic capacitor thereon, in which a dielectric layer on which inner electrodes are disposed is stacked and external electrode terminals connecting the inner electrodes in parallel are disposed on both ends thereof, wherein the inner electrodes of the multi-layered ceramic capacitor and the circuit board are disposed so as to be a horizontal direction to connect the external electrode terminals with a land on the circuit board by a conductive material and a ratio of a bonding area $A_{SOLDER}$ of the conductive material to the area $A_{MLCC}$ of the external electrode terminals $A_{MLCC}$ is set to be less than 1.4, thereby remarkably reducing the vibration noise.

6 Claims, 2 Drawing Sheets

(56) References Cited

U.S. PATENT DOCUMENTS

| | | | |
|---|---|---|---|
| 5,838,070 A * | 11/1998 | Naruse et al. | 257/779 |
| 6,418,009 B1 * | 7/2002 | Brunette | 361/306.3 |
| 7,045,902 B2 * | 5/2006 | Liu | 257/780 |
| 2002/0007908 A1 * | 1/2002 | Mamada | 156/293 |
| 2003/0184986 A1 * | 10/2003 | Soga et al. | 361/767 |
| 2004/0183147 A1 * | 9/2004 | Togashi et al. | 257/414 |
| 2005/0056458 A1 * | 3/2005 | Sugiura | 174/260 |
| 2005/0178002 A1 * | 8/2005 | Maeno | 29/840 |
| 2006/0007640 A1 * | 1/2006 | Ishifune et al. | 361/523 |
| 2006/0221550 A1 * | 10/2006 | Ryu et al. | 361/321.5 |
| 2010/0097739 A1 * | 4/2010 | Prymak | 361/301.4 |

FOREIGN PATENT DOCUMENTS

| | | |
|---|---|---|
| JP | 2003-086927 A | 3/2003 |
| JP | 2011-049351 A | 3/2011 |
| JP | 2011-108827 A | 6/2011 |

* cited by examiner

MOUNTING STRUCTURE OF CIRCUIT BOARD HAVING MULTI-LAYERED CERAMIC CAPACITOR THEREON

BACKGROUND OF THE INVENTION

1. Technical Field

The present invention relates to a mounting structure and a mounting method of a circuit board having a multi-layered ceramic capacitor thereon, and more particular, to a mounting structure of a circuit board having a multi-layered ceramic capacitor thereon capable of remarkably reducing vibration noise of the multi-layered ceramic capacitor by forming on a surface of the circuit board a land having the multi-layered ceramic capacitor mounted thereon and connecting the land with external electrode terminals of the multi-layered ceramic capacitor by a conductive material while setting a ration of a bonding area of the conductive material to be less than 1.4 as compared with an area of the external electrode terminal of the multi-layered ceramic capacitor.

2. Description of the Related Art

Generally, a multi-layered ceramic capacitor (MLCC) is a chip type capacitor that is mounted on a printed circuit board of various electronic products such as mobile communication terminals, notebooks, computers, personal digital assistants (PDAs), or the like, and plays an important role of charging or discharging electricity and has various sizes and stacked shapes according to usage and capacitance.

In addition, the multi-layered ceramic capacitor has a structure in which inner electrodes having different polarities are alternately stacked between a plurality of dielectric layers.

The multi-layered ceramic capacitor has been prevalently used as parts of various electronic devices due to advantages such as miniaturization, large capacitance, and easiness of mounting.

As a ceramic material forming a laminate of the multi-layered ceramic capacitor, a ferroelectric material such as barium titanate having a relatively higher dielectric constant is generally used. Since the ferroelectric material has piezo-electricity and electrostriction, when electric field is applied to the ferroelectric material, stress and mechanical deformation are shown as vibrations, which are transferred from the electrode terminal of the multi-layered ceramic capacitor to the board side.

That is, when AC voltage is applied to the multi-layered ceramic capacitor, stresses Fx, Fy, and Fz are applied to a main body of the multi-layered ceramic capacitor device in each direction of X, Y, and Z, which results in generating vibrations. The vibrations are transferred from the electrode terminal to the entire board which is an acoustic radiation surface, thereby generating noise, that is, vibrating sound.

The vibrating sound approximately corresponds to vibrating sound of an audible frequency (20 to 20,000 Hz) which may include a compass that gives a person an unpleasant feeling. Therefore, a need exists for a solution to the above problem.

Recently, in order to solve the problems due to the above-mentioned vibrating sound, various technologies, such as a technology of preventing vibrations due to an elastic deformation in the external terminal of the multi-layered ceramic capacitor, a technology of introducing separate parts for reducing generation of noise by suppressing propagation of vibrations generated due to piezoelectricity and electrostriction, a technology of forming board holes around the multi-layered ceramic capacitor mounted so as to suppress the vibrations of the board, or the like, has been disclosed, which require separate processes and are insufficient in a vibration prevention effect compared with the complexity of processes.

Meanwhile, as the multi-layered ceramic capacitor, there is a multi-layered ceramic capacitor having the substantially same width and thickness. In the case of the multi-layered ceramic capacitor having the substantially same width and thickness, when the multi-layered ceramic capacitor is mounted on the printed circuit board since directivity of inner conductors of the multi-layered ceramic capacitor cannot be recognized from the outside of the multi-layered ceramic capacitor, the multi-layered ceramic capacitors are mounted on the printed circuit board, regardless of the directivity of the inner conductors.

The differences in characteristics of the multi-layered ceramic capacitor are generated according to the direction of the inner conductors of the multi-layered ceramic capacitor mounted on the printed circuit board. In particular, the large difference in vibration noise characteristics due to the piezo-electricity of the multi-layered ceramic capacitor is shown.

In particular, it is found from the recent experiment results that the mounting direction of the multi-layered ceramic capacitor and the amount of a conductive material connecting the external electrode terminals of the multi-layered ceramic capacitor with the land are correlated with each other, which has a large effect on the vibration noise characteristics.

In particular, a need exists for a mounting structure and a mounting method capable of mounting the inner electrode surface of the multi-layered ceramic capacitor so as to be horizontal with the surface of the printed circuit board and remarkably reducing the vibration noises of the multi-layered ceramic capacitor by the ratio of the bonding area of the conductive material connecting the external electrode terminals of the multi-layered ceramic capacitor with the land to the external electrode terminal.

SUMMARY OF THE INVENTION

An object of the present invention is to provide a mounting structure of a circuit board having a multi-layered ceramic capacitor thereon capable of reducing noises generated due to vibrations caused by a piezoelectric phenomenon according to a ratio of a bonding area of a conductive material bonded to external electrode terminals of a multi-layered ceramic capacitor.

According to an exemplary embodiment of the present invention, there is provided a mounting structure of a circuit board having a multi-layered ceramic capacitor thereon, in which a dielectric layer on which inner electrodes are disposed is stacked and external electrode terminals connecting the inner electrodes in parallel are disposed on both ends thereof, wherein the inner electrodes of the multi-layered ceramic capacitor and the circuit board are disposed so as to be a horizontal direction to connect the external electrode terminals with a land on the circuit board by a conductive material and a ratio of a bonding area $A_{SOLEDER}$ of the conductive material to the area $A_{MLCC}$ of the external electrode terminals $A_{MLCC}$ is set to be less than 1.4.

In this case, where the area $A_{MLCC}$ of the external electrode terminals defines the length and width of the external electrode terminals disposed on both ends of the multi-layered ceramic capacitor as $L_{MLCC}$ and $W_{MLCC}$, respectively, to be defined as the area calculated by a product of the length and the width. The bonding area $A_{SOLDER}$ of the conductive material defines the length and the width of the conductive material bonded to the external electrode terminal of the multi-layered capacitor as $L_{SOLDER}$ and $W_{SOLDER}$, respectively, to be defined as the area calculated by a product of the length and the width.

In addition, in the mounting structure of a circuit board having a multi-layered ceramic capacitor thereon, the ratio of the bonding area $A_{SOLDER}$ of the conductive material to the area $A_{MLCC}$ of the external electrode terminal may be set to be 0.6 or more to 1.4 or less.

More preferably, the ratio of the bonding area $A_{SOLDER}$ of the conductive material to the area $A_{MLCC}$ of the external electrode terminal may be set to be 0.6 or more to 1.1 or less.

In this case, when the multi-layered ceramic capacitor is packaged in a package like a reel, the multi-layered ceramic capacitor is subjected to the taping to be aligned in one direction so that the inner electrodes of the multi-layered ceramic capacitor may be mounted on the circuit board in a horizontal direction, wherein the multi-layered ceramic capacitor may have the same and similar width W and thickness T. In this case, the same width and thickness of the multi-layered ceramic capacitor may means the same in a social common notion rather than in a physical value and the similar width and thickness of the multi-layered ceramic capacitor may be in the range of $0.75 \leq T/W \leq 1.25$. That is, the multi-layered ceramic capacitor may have a rectangular parallelepiped shape having the external electrode terminals disposed at both ends thereof.

Meanwhile, as the number of dielectric layers of the multi-layered ceramic capacitor is increased or the electric field applied to the dielectric is large, stress and mechanical deformations due to piezoelectricity of the multi-layered ceramic capacitor is increased. In particular, when the number of dielectric layers is 200 layers or more or the dielectric thickness is 3 μm or less, the vibration noise remarkably occurs.

Therefore, the number of dielectric layers of the multi-layered ceramic capacitor may be 200 layers or more and the dielectric thickness of the dielectric layer may be 3 μm or less. In this case, the dielectric thickness may be 3 μm or less while the number of dielectric layers of the multi-layered ceramic capacitor is 200 layers or more.

DESCRIPTION OF THE PREFERRED EMBODIMENTS

The acting effects and technical configuration with respect to the objects of a mounting structure of a circuit board having a multi-layered ceramic capacitor thereon according to the present invention will be understood by the following description in which exemplary embodiments of the present invention are described with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Therefore, the configurations described in the embodiments and drawings of the present invention are merely most preferable embodiments but do not represent all of the technical spirit of the present invention. Thus, the present invention should be construed as including all the changes, equivalents, and substitutions included in the spirit and scope of the present invention at the time of filing this application.

Figure 1:
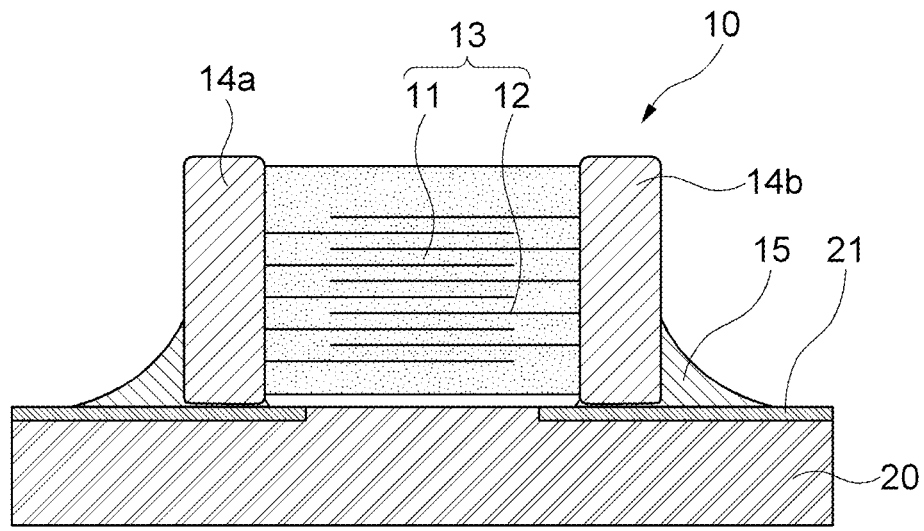
FIG. 1 is a cross-sectional view of a form in which a multi-layered ceramic capacitor is mounted on a circuit board, according to a structure of an exemplary embodiment of the present invention.
Figure 2:
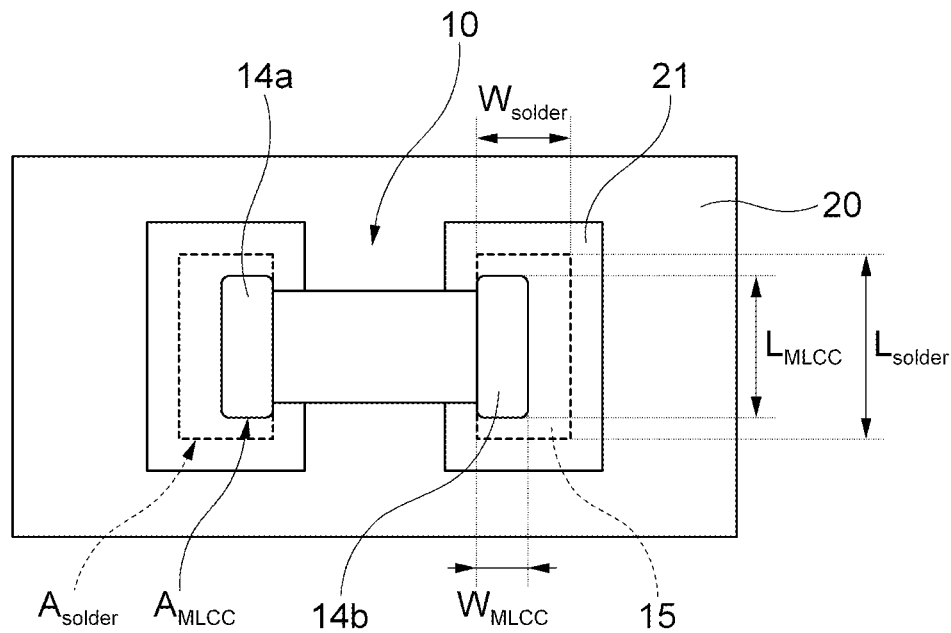
FIG. 2 is a plan view of a state in which a multi-layered capacitor is mounted on a circuit board, according to the structure of the present invention.

FIG. 1 is a cross-sectional view of a form in which a multi-layered ceramic capacitor is mounted on a circuit board, according to a structure of an exemplary embodiment of the present invention and FIG. 2 is a plan view of a state in which a multi-layered capacitor is mounted on a circuit board, according to the structure of the present invention.

As shown, in a mounting structure and a mounting method of a circuit board having a multi-layered ceramic capacitor thereon according to an exemplary embodiment of the present invention in which a dielectric layer 11 on which inner electrodes 12 are disposed is stacked and external electrode terminals 14a and 14b connecting the inner electrodes 12 in parallel are disposed on both ends thereof, wherein a land 21 on which the multi-layered ceramic capacitor 10 is mounted is disposed on the surface of the circuit board 20, the inner electrodes 12 of the multi-layered ceramic capacitor 10 and the circuit board 20 are disposed so as to be a horizontal direction to connect the external electrode terminals 14a and 14b with a land in a conductible state and a ratio of a bonding area $A_{SOLEDER}$ of the conductive material to the area $A_{MLCC}$ of the external electrode terminals 14a and 14b may be set to be less than 1.4.

In this configuration, the area $A_{MLCC}$ of the external electrode terminals 14a and 14b defines the length and width of the external electrode terminals 14a and 14b disposed on both ends of the multi-layered ceramic capacitor as $L_{MLCC}$ and $W_{MLCC}$, respectively, to be defined as the area calculated by a product of the length and the width. The bonding area $A_{SOLDER}$ of the conductive material 15 defines the length and the width of the conductive material 15 bonded to the external electrode terminal of the multi-layered capacitor as $L_{SOLDER}$ and $W_{SOLDER}$, respectively, to be defined as the area calculated by a product of the length and the width.

As shown in FIG. 1, the multi-layered ceramic capacitor 10 may be configured to include an element body 13 formed by alternately stacking the dielectric layer 11 and the inner electrodes 12 and a pair of the external electrodes 14a and 14b alternately connecting with the inner electrodes at both ends of the element body 13 in parallel.

The dielectric layer 11 is made of a ferroelectric material using barium titanate as main components and includes a ferroelectric material in addition to the barium titanate.

The inner electrode 12 is made of a metal thin film by sintering a metal paste. As the metal paste, a metal material such as, for example, Ni, Pd, Ag—Pd, Cu, or the like, has been used as a main component.

The external electrodes 14a and 14b are made of a metal material such as Cu, Ni, or the like, and the surface thereof may be subjected to soldering plating in order to make soldering wettability good.

The surface of the circuit board 20 is provided with the land for mounting the multi-layered ceramic capacitor. In this case, the land 21 is a portion in which the solder resist in the circuit board 20 is exposed and the multi-layered ceramic capacitor 10 is mounted on the land 21 by coating the conductive material 15 on the top surface of the exposed solder resist to bond the multi-layered ceramic capacitor 10 thereto. In this case, as the circuit board 20, a multi-layered circuit board, a single-layered both-sided print board, or the like, may be used, but a type of the circuit board 20 may not particularly limited thereto.

Figure 3A:
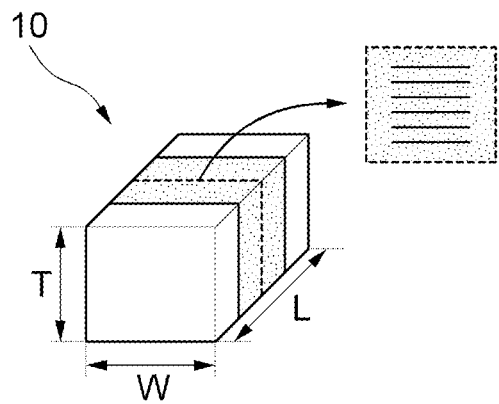
FIG. 3 is a perspective view showing (A) a multi-layered ceramic capacitor having like width and thickness and (B) a multi-layered ceramic capacitor having a width larger than a thickness.
Figure 3B:
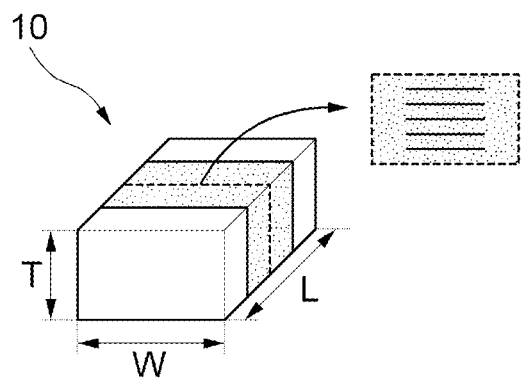

In addition, as shown in FIG. 3, the multi-layered ceramic capacitor 10 may be manufactured to have the same width (W) and the thickness (T), or the substantially same width and thickness (FIG. 3A), and the width larger than the thickness (FIG. 3B). In the latter case, regardless of intention, the thickness is thinner than the width, which may be differentiated with the naked eye. Therefore, the stacked ceramic capacitor 10 may be mounted horizontally. In the former case, it is difficult to differentiate only the size of the width and the thickness with the naked eye, such that the horizontal mounting and the vertical mounting may be performed randomly. In particular, when the multi-layered ceramic capacitor is packaged in a package like a reel, the multi-layered ceramic capacitor is subjected to the taping to be aligned in one direction so that the inner electrodes of the multi-layered ceramic capacitor may be mounted on the circuit board in a horizontal direction. In the case of the multi-layered ceramic capacitor having the same and similar width W and thickness T, the noise reduction effect due to the vibrations may be more increased at the time of performing the horizontal mounting. In this case, the same and similar width and thickness of the multi-layered ceramic capacitor may be in the range of $0.75 \leq T/W \leq 1.25$.

The conductive material 15 serves as a vibration medium between the stacked ceramic capacitor 10 and the circuit board 20 while serving as a bonding part for fixing the multi-layered capacitor 10 and the circuit board 20. As the bonding area of the conductive material 15 is small, the role of the vibration medium becomes small, such that the vibration transfer to the board may be degraded.

In particular, when the multi-layered ceramic capacitor is mounted horizontally, the transfer of the top vibration of the conductive material 15 is rapidly degraded together with the reduction in the bonding area of the conductive material 15 during the vibration of the edge portion by the piezoelectricity of the multi-layered ceramic capacitor 10, such that the reduction width of vibration noise is very large due to the ratio of the bonding area of the conductive material 15 when being mounted in a horizontal direction.

On the other hand, when the multi-layered ceramic capacitor is mounted in a vertical direction, the effect is not generated, such that the reduction width in the vibration noise is not large according to the bonding area of the conductive material 15.

Therefore, in order to reduce the noises due to the multi-layered ceramic capacitor, the multi-layered capacitor 10 may be mounted to be horizontal with the circuit board 20 based on the inner electrode 12 and the vibration transfer may be reduced by reducing the bonding area of the conductive material 15 to the area of the external electrode terminals 14a and 14b.

The size of the multi-layered ceramic capacitor may be 0603 (L×W=0.6 mm×0.3 mm), 1005, 1608, 2012, 3216, 3225, or the like, according to the width W and the length L of the multi-layered ceramic capacitor of FIG. 3. In the case of the multi-layered ceramic capacitor having the size of 3216 or more, since an absolute amount of the conductive material for bonding both members is increased even though the bonding area of the conductive material is smaller as compared with the bonding area of the external electrode terminal of the multi-layered ceramic capacitor, the ratio of the bonding area of the conductive material may be maintained to be less than 1.4 as compared with the area of the external electrode terminal in order to increase the reduction effect of the vibration noise.

Meanwhile, when the circuit board 20 of the multi-layered ceramic capacitor is mounted, the vibration noise is generally limited to be less than 30 dB in the art. However, the vibration noise is regulated up to 25 dB, as a tolerance as electronic products are thin and small recently.

In connection with this, as shown in the following Table 1, in the mounting structure of a circuit board having a multi-layered ceramic capacitor thereon, when the ratio of the bonding area $A_{SOLDER}$ of the conductive material is set to be 0.6 or more to 1.4 or less to the area $A_{MLCC}$ of the external electrode terminal, the vibration noise may be maintained to be less than 30 dB. More preferably, when the ratio of the bonding area $A_{SOLDER}$ of the conductive material to the area $A_{MLCC}$ of the external electrode terminal is set to be 0.6 or more to 1.1 or less, the vibration noise of the multi-layered ceramic capacitor may be managed to be 25 dB or less.

TABLE 1

| Ratio of Conductive Bonding Area | Horizontal Mounting MLCC Vibrating Sound (dB) |
| --- | --- |
| 0.72 | 18.2 |
| 0.95 | 19.8 |
| 1.00 | 21.1 |
| 1.11 | 21.5 |
| 1.18 | 25.9 |
| 1.31 | 27.6 |
| 1.32 | 28.3 |
| 1.41 | 29.4 |
| 1.53 | 33.2 |
| 1.64 | 33.8 |
| 1.73 | 34.4 |
| 1.90 | 34.9 |
| 1.96 | 35.6 |
| 2.15 | 36.1 |
| 2.27 | 36.3 |
| 2.57 | 36.2 |

In this case, as described above, it can be appreciated that as the bonding area of the conductive material bonding the multi-layered ceramic capacitor to the land is minimized, the vibration noise is reduced. When the ratio of the bonding area of the conductive material 15 to the area of the external electrode terminals 14a and 14b is set to be less than 0.6, the adhesion between the external electrode of the multi-layered ceramic capacitor and the land of the circuit board is remarkably reduced, such that the reliability may be degraded.

The conductive material 15 is an electricity conducting material for electrical connection between the circuit board 20 and the multi-layered ceramic capacitor, which is not particularly limited thereto, but as the conductive material, the solder is generally used.

As set forth above, the mounting structure of the circuit board of the multi-layered ceramic capacitor according to the exemplary embodiment of the present invention can remarkably reduce the noise generation by suppressing the vibrations generated from the multi-layered ceramic capacitor from being transferred to the board by controlling the bonding area of the conductive material connecting the external electrode terminals of the multi-layered ceramic capacitor with the land patterns of the circuit board when the multi-layered ceramic capacitor is bonded to the circuit board by the conductive material.

While the present invention has been shown and described in connection with the embodiments, it will be apparent to those skilled in the art that modifications and variations can be made without departing from the spirit and scope of the invention as defined by the appended claims.

What is claimed is:

1. A mounting structure of a circuit board having a multi-layered ceramic capacitor thereon, in which a dielectric layer on which inner electrodes are stacked in a first direction and external electrode terminals connecting the inner electrodes in parallel are disposed on both ends thereof, wherein
the inner electrodes of the multi-layered ceramic capacitor and the circuit board are arranged to extend along a second direction substantially perpendicular to the first direction, the external electrode terminals are connected with lands on the circuit board by a conductive material,
a ratio of a bonding area $A_{SOLDER}$ of the conductive material to the area $A_{MLCC}$ of the external electrode terminals $A_{MLCC}$ is more than 0.72 and less than 1.2, thereby reducing vibration noise,
and the conductive material extends outwardly in length and width directions from a contact face between the external electrodes and the land,
wherein the area $A_{MLCC}$ of the external electrode terminals defines length and width of the external electrode terminal disposed on both ends of the multi-layered ceramic capacitor as $L_{MLCC}$ and $W_{MLCC}$, respectively, defining the area calculated by a product of the length and the width, and
the bonding area $A_{SOLDER}$ of the conductive material defines length and width of the conductive material bonded to the external electrode terminal of the multi-layered capacitor as $L_{SOLDER}$ and $W_{SOLDER}$, respectively, defining the area calculated by a product of the length and the width.

2. The mounting structure according to claim 1, wherein the multi-layered ceramic capacitor is taped so as to be mounted in the second direction and has substantially a same width W and thickness T.

3. The mounting structure according to claim 1 or 2, wherein a number of dielectric layers of the multi-layered ceramic capacitor is 200 layers or more.

4. The mounting structure according to claim 1 or 2, wherein a thickness of the dielectric layer of the multi-layered ceramic capacitor is 3 µm or less.

5. The mounting structure according to claim 1 or 2, wherein a number of dielectric layers of the multi-layered ceramic capacitor is 200 layers or more and a thickness of the dielectric is 3 µm or less.

6. The mounting structure according to claim 1, wherein the ratio of the bonding area $A_{SOLDER}$ of the conductive material to the area $A_{MLCC}$ of the external electrode terminal is more than 0.72 to 1.1 or less.

* * * * *